(12) United States Patent
Shrivastava et al.

(10) Patent No.: US 12,483,259 B2
(45) Date of Patent: Nov. 25, 2025

(54) METASTABILITY ERROR DETECTION AND BER IMPROVEMENT TECHNIQUE IN PIPELINED ADCS

(71) Applicant: TEXAS INSTRUMENTS INCORPORATED, Dallas, TX (US)

(72) Inventors: Neeraj Shrivastava, Bangalore (IN); Visvesvaraya Appala Pentakota, Bangalore (IN); Sai Vikas Kandimalla, Nalgonda (IN); Samriddh Bhalla, Mhow (IN); Abhijith N, Mangaluru (IN); Prabhansh Pandey, Singrauli (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 181 days.

(21) Appl. No.: 18/525,051

(22) Filed: Nov. 30, 2023

(65) Prior Publication Data

US 2025/0183906 A1    Jun. 5, 2025

(51) Int. Cl.
*H03M 1/12* (2006.01)
*H03K 19/20* (2006.01)
*H03M 1/16* (2006.01)
*H03M 1/46* (2006.01)

(52) U.S. Cl.
CPC .......... *H03M 1/1205* (2013.01); *H03K 19/20* (2013.01); *H03M 1/1245* (2013.01); *H03M 1/165* (2013.01); *H03M 1/466* (2013.01)

(58) Field of Classification Search
CPC ....... H03M 1/1205; H03M 1/65; H03M 1/466
See application file for complete search history.

(56) References Cited

U.S. PATENT DOCUMENTS

| | | |
|---|---|---|
| 6,340,944 B1 | 1/2002 | Chang et al. |
| 7,486,216 B2 | 2/2009 | Lee et al. |
| 2009/0135037 A1* | 5/2009 | Agarwal ............ H03M 1/0624 341/143 |
| 2009/0267815 A1 | 10/2009 | Murden et al. |
| 2014/0062736 A1* | 3/2014 | Nandi ................. H03M 1/0675 341/110 |
| 2017/0111055 A1* | 4/2017 | El-Chammas ........ H03M 1/129 |

* cited by examiner

*Primary Examiner* — Peguy Jean Pierre
(74) *Attorney, Agent, or Firm* — Mandy Barsilai Fernandez; Frank D. Cimino

(57) ABSTRACT

In an example, a system includes a pipelined analog-to-digital converter (ADC) having a main path and an auxiliary path. The main path includes a first stage having a sampling switch, a flash ADC having an input coupled to the sampling switch, a digital-to-analog converter (DAC) having an input coupled to an output of the flash ADC, and a first amplifier having an input coupled to an output of the DAC and the sampling switch. The main path includes a second stage coupled to the first stage and an input of a second amplifier. The main path also includes a backend ADC having an input coupled to an output of the second amplifier. The auxiliary path includes a plurality of metastability comparators coupled to the flash ADC.

20 Claims, 7 Drawing Sheets

METASTABILITY ERROR DETECTION AND BER IMPROVEMENT TECHNIQUE IN PIPELINED ADCS

BACKGROUND

A pipelined analog-to-digital converter (ADC) converts an analog input signal to a digital output signal. Pipelined ADCs have multiple cascaded stages, where each stage resolves a few bits. Each stage of the pipelined ADC may include a sampler, a sub-ADC (e.g., a flash ADC), a digital-to-analog converter (DAC), a subtractor, and a gain amplifier. An analog input signal is sampled, and the flash ADC in the first stage quantizes the sample to a certain number of bits. Those bits are fed to a similar sized DAC, and the analog output of the DAC is subtracted from the input by the subtractor. This residue is then amplified with a gain amplifier and fed to the next stage. The next stage does the same thing for a certain number of bits, and so on until the entire digital sample is created. The last ADC resolves the final bits. The resolved bits may be time-aligned with shift registers before going to the next stage (such as error correction). This allows the stages to work in parallel on different samples.

SUMMARY

In at least one example of the description, a system includes a pipelined analog-to-digital converter (ADC) having a main path and an auxiliary path. The main path includes a first stage having a sampling switch, a flash ADC having an input coupled to the sampling switch, a digital-to-analog converter (DAC) having an input coupled to an output of the flash ADC, and a first amplifier having an input coupled to an output of the DAC and the sampling switch, where the first stage is configured to produce a sample of an input signal and produce a first residue value. The main path includes a second stage coupled to the first stage and an input of a second amplifier, where the second stage is configured to produce a sample of the first residue value and produce a second residue value. The main path also includes a backend ADC having an input coupled to an output of the second amplifier, where the backend ADC is configured to produce a sample of the second residue value and to quantize the second residue value. The auxiliary path includes a plurality of metastability comparators coupled to the flash ADC, where each metastability comparator is configured to detect a metastability of a comparator in the flash ADC.

In at least one example of the description, a pipelined ADC includes a first ADC path. The first ADC path includes a first stage ADC including a flash ADC and a first amplifier coupled to the flash ADC, the first amplifier having an input and an output. The first ADC path also includes a second stage ADC having an input coupled to the output of the first amplifier, and having an output. The first ADC path includes a second amplifier having an input and an output. The first ADC path also includes a third stage ADC having an input coupled to the output of the second amplifier. The pipelined ADC includes a second ADC path coupled to the input of the first amplifier, and having an output. The pipelined ADC includes a metastability comparator having an input coupled to the flash ADC, and having an output. The pipelined ADC also includes a logic circuit having an input coupled to the output of the metastability comparator and having an output. The pipelined ADC includes a path selection circuit having a first input coupled to the output of the second stage ADC, having a second input coupled to the output of the second ADC path, having a select input coupled to the output of the logic circuit, and having an output coupled to the input of the second amplifier.

In at least one example of the description, a system includes a pipelined ADC having a main path and an auxiliary path. The main path includes a first stage having an input, an output, a sampling switch, a flash ADC coupled to the sampling switch, a digital-to-analog converter (DAC) coupled to the flash ADC, and a first amplifier coupled to the DAC and the sampling switch. The main path also includes a second stage having an input coupled to the output of the first stage and to an input of a second amplifier. The main path includes a first backend ADC having an input coupled to an output of the second amplifier. The auxiliary path includes a plurality of metastability comparators coupled to the flash ADC. The auxiliary path also includes selection circuitry coupled to an output of the DAC and the plurality of metastability comparators. The auxiliary path includes a buffer having an input and an output, the input coupled to an output of the selection circuitry. The auxiliary path also includes a second backend ADC coupled to the output of the buffer.

BRIEF DESCRIPTION OF THE DRAWINGS

The same reference numbers or other reference designators are used in the drawings to designate the same or similar (functionally and/or structurally) features.

DETAILED DESCRIPTION

Pipelined ADCs could suffer from metastability problems caused by the sub-ADC in each stage (e.g., the flash ADC). Metastability occurs when a comparator in the flash ADC does not have enough time to regenerate a small input voltage level to sufficient digital voltage levels. The metastability error (Bit Error Rate (BER)) has two parts: the probability for a metastable event to occur, and the magnitude of error when metastability occurs. BER is an important specification for multiple applications such as wireless communication, radars, and test and measurement. Metastability errors degrade the signal to noise ratio (SNR) of the ADC.

In examples herein, delay domain comparators detect the metastability of the flash ADC comparators. Also, the residue of the first stage of the pipelined ADC is provided to the main path of the ADC (e.g., a first ADC path) and an auxiliary path. If no metastability is detected, the residue passes to the main path. If the delay domain comparators detect metastability, the residue is provided to the auxiliary path, which provides more time for the flash ADC comparators to settle. Because of the additional time for settling, the BER may be reduced. Multiple architectures are described herein for implementing the auxiliary path.

Figure 1:
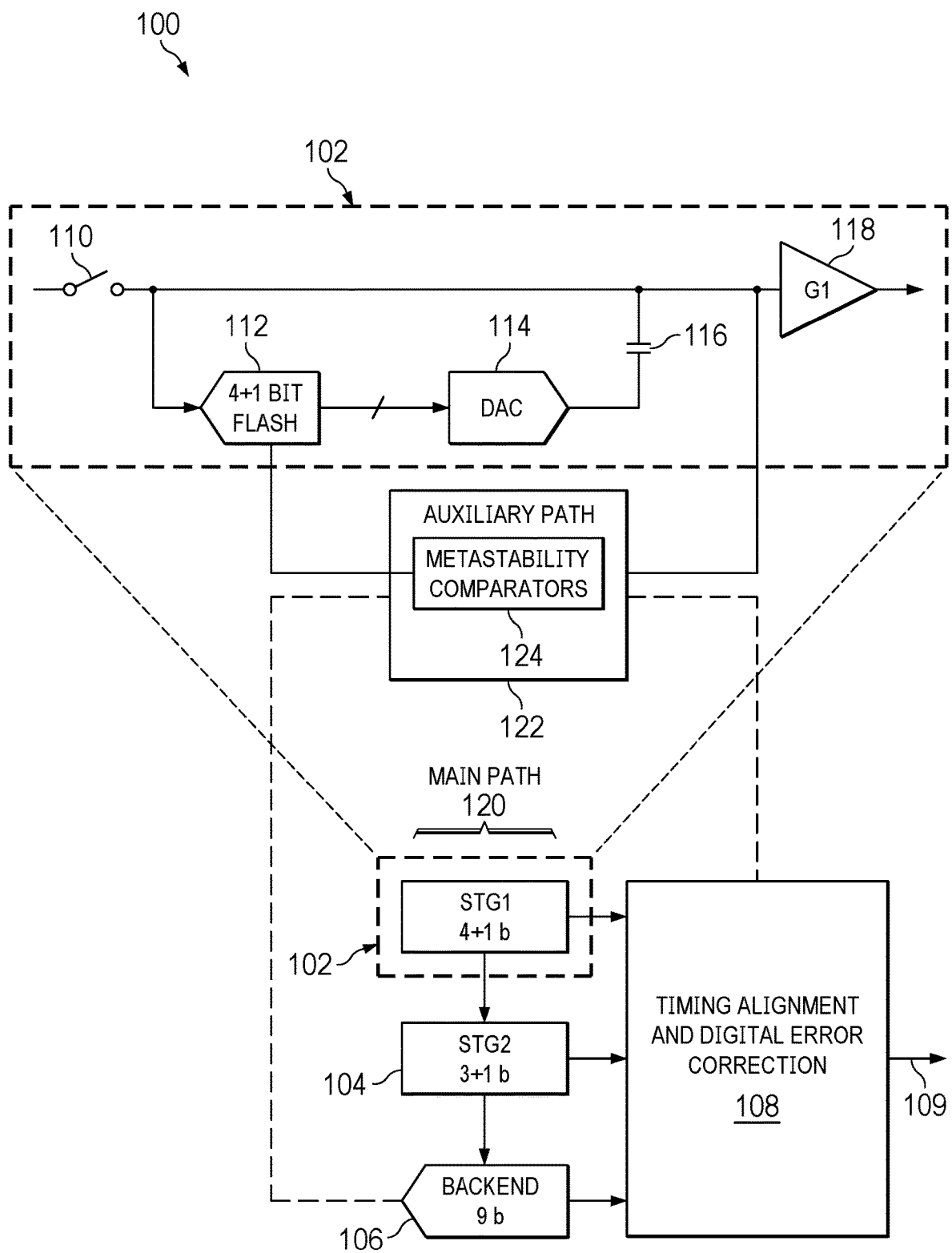
FIG. 1 is a block diagram of an example pipelined ADC incorporating a metastability comparator.

FIG. 1 is a block diagram of an example pipelined ADC 100. Pipelined ADC 100 includes a first stage 102 (e.g., a first stage ADC), a second stage 104 (e.g., a second stage ADC), and a backend ADC 106 (e.g., a third stage ADC). The backed ADC 106 is a final stage ADC in one example. In other examples, pipelined ADC 100 may have more than three stages, depending on the bit resolution of pipelined ADC 100. Pipelined ADC 100 also includes timing alignment and digital error correction circuitry 108. Timing alignment and digital error correction circuitry 108 includes an output terminal 109. First stage 102 includes switch 110, flash ADC 112, DAC 114, capacitor 116, and gain amplifier 118. Second stage 104 also includes elements similar to first stage 102, but those elements are not shown in FIG. 1. Backend ADC 106 also includes elements similar to first stage 102, but those elements are not shown in FIG. 1. First stage 102, second stage 104, and backend ADC 106 are included in main path 120. Pipelined ADC 100 also includes auxiliary path 122. Auxiliary path 122 includes metastability comparators 124. Examples of the circuitry and logic within auxiliary path 122 are described below.

Flash ADC 112 has an input coupled to switch 110 and an output coupled to an input of DAC 114. DAC 114 has an output coupled to a first terminal of capacitor 116. Capacitor 116 has a second terminal coupled to switch 110 and an input of gain amplifier 118. Gain amplifier 118 has an output coupled to the input of the next stage of pipelined ADC 100, which is second stage 104 in this example. Second stage 104 has an output coupled to backend ADC 106. First stage 102, second stage 104, and backend ADC 106 are each coupled to timing alignment and digital error correction circuitry 108. Auxiliary path 122 has an input coupled to flash ADC 112 and an output coupled to switch 110 and the second terminal of capacitor 116.

In an example, first stage 102 receives an analog input signal. Switch 110 is a sampling switch that samples the input signal. Switch 110 is a transistor switch (e.g., a field effect transistor (FET)) in one example In another example, a sample and hold circuit is useful for sampling the analog input signal. Flash ADC 112 quantizes the sample to a certain number of bits. In this case, flash ADC 112 produces 4 bits and the residue (e.g., 4+1 bits, where +1 represents the residue or residue value). These bits are produced with a resistor ladder and comparators in flash ADC 112, in one example. Opening and closing, enabling and disabling, and turning ON and OFF of switches may be controlled by a controller (not shown) which can have any suitable implementation in hardware, software, firmware, or a combination.

Flash ADC 112 uses 32 comparators to produce the 4+1 bits, in one example. The four bits are provided from flash ADC 112 to timing alignment and digital error correction circuitry 108. The remainder bit (e.g., the residue) is provided from flash ADC 112 to DAC 114. DAC 114 produces an analog output that is provided to capacitor 116. Capacitor 116 is a sampling capacitor that is be multiple capacitors in parallel in one example. The analog output of DAC 114 is subtracted from the input signal sample to produce the residue. The residue is provided to gain amplifier 118, where the residue is amplified responsive to a gain G1 and provided to second stage 104. The gain G1 is a gain between 1.5× and 10× in some examples, but any value of G1 is useful in other examples.

Second stage 104 performs a similar function as first stage 102. In this example, second stage 104 resolves 3+1 bits (e.g., 3 bits and the residue) to provide to timing alignment and digital error correction circuitry 108. The residue from second stage 104 is provided to backend ADC 106. Backend ADC 106 resolves 9+1 bits (e.g., 9 bits and the residue) in this example. Therefore, in the main path 120, first stage 102, second stage 104, and backend ADC 106 provide 16 bits of digital data to timing alignment and digital error correction circuitry 108. Timing alignment and digital error correction circuitry 108 may align the resolved bits with shift registers, and perform error correction. Therefore, the stages can work in parallel on different samples of the input signal. Timing alignment and digital error correction circuitry 108 includes any hardware, logic, or circuitry suitable for performing alignment and error correction. Timing alignment circuitry aligns the signals from each of the one or more stages (e.g., 102, 104, 106) to produce an aligned digital output signal at output terminal 109. Timing alignment circuitry uses shift registers in one example. In an example, error correction logic and/or circuitry corrects the state of one or more bits of the digital output signal from one or more of the stages 102, 104, 106. Any suitable error correction codes are useful in various examples, such as Hamming codes, Reed-Solomon codes, cyclic redundancy checks, BCH (Bose-Chaudhuri-Hocquenghem) codes, etc. Timing alignment and digital error correction circuitry 108 produces an aligned and error corrected digital output signal at output terminal 109 with the appropriate number of bits as described herein.

Metastability errors occur in some examples. In an example, first stage 102 completes four functions in one period of the clock, before a next transition of the clock. For example, the analog input signal is sampled at a certain clock rate, where the clock signal is produced by a suitable clock source (not shown in FIG. 1). In one example, the pipelined ADC 100 operates at 1.5 gigasamples per second (GSPS). The clock rate indicates the rate at which switch 110 is sampling the analog input signal. For proper operation, each stage in ADC 100 completes its functions for a first sample before the next sample is provided by switch 110 (e.g., at the clock rate).

Figure 2:
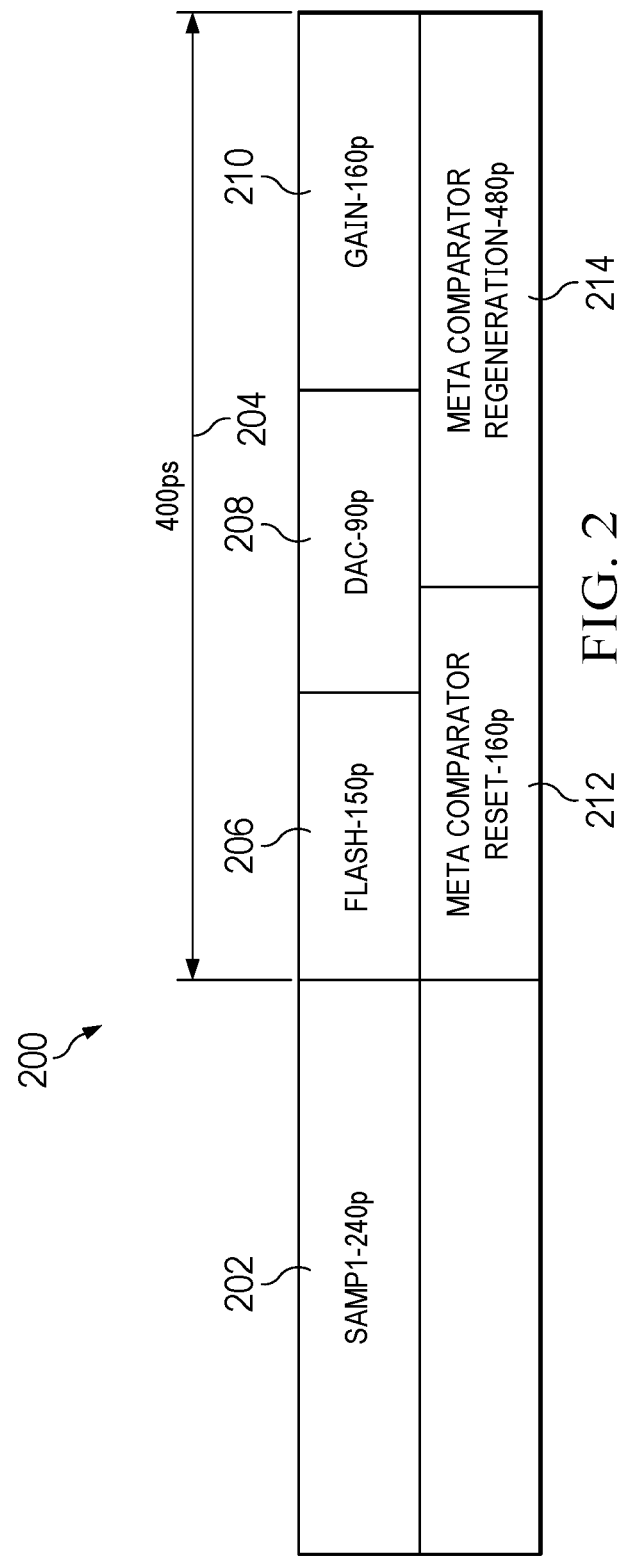
FIG. 2 is an example timing diagram for a first stage of an ADC.

The four functions include sampling the input signal, quantizing the sample using the flash ADC 112, applying the DAC 114, and amplifying the residue with gain amplifier 118. These four functions are performed in order and take a certain amount of time, as described below. The four functions are to be completed before the next sample occurs. FIG. 2, described below, shows an example timing diagram for a stage of the ADC. Flash ADC 112 has to resolve in time for the next functions (DAC 114 and gain amplifier 118) to timely occur. If flash ADC 112 cannot resolve in time, a metastability error occurs. Metastability may be prevented by giving more time for flash ADC 112 to resolve. Other solutions may include tradeoffs in performance, power, etc.

In examples herein, one or more metastability comparators 124 determine if one or more of the comparators within flash ADC 112 are metastable. If flash ADC 112 is metastable, the residue from first stage 102 is provided to auxiliary path 122. The residue may also be provided to second stage 104, and based on the metastability detection result, the output of either a main path or an auxiliary path is passed to a multiplexer. The auxiliary path 122 may include a backend ADC (not shown), e.g., similar to backend ADC 106, but not include a second stage 104. In one example, the auxiliary path 122 has an output coupled to an input of the timing alignment and digital error correction circuitry 108, for providing the resolved bits. Alternatively, an output of the auxiliary path 122 is coupled to an input of the backend ADC 106. In both examples, the auxiliary path 122 may resolve 13 bits rather than 16 bits from the main path 120. The last 3 bits are missing from the auxiliary path 122. Thus, the error may be plus or minus 8 least significant bits (LSBs) (e.g., 2^3). However, if the flash ADC 112 in first stage 102 is metastable, the error may occur in the 5$^{th}$ bit out of the 16 bits, which means the error could be 2^11, or 2048 LSBs. Therefore, during metastability conditions, sending the residue from first stage 102 to the auxiliary path 122 may significantly reduce the BER. Additional descriptions and architectures for auxiliary path 122 are described below.

FIG. 2 is an example timing diagram 200 for a first stage of an ADC. The first stage is first stage 102 in one example. Timing diagram 200 includes timeframes 202, 204, 206, 208, 210, 212, and 214. Timing diagram 200 represents one period of the clock in one example. In this example, the pipelined ADC 100 operates at 1.5 gigasamples per second (GSPS).

In one example, the pipelined ADC 100 completes four functions in one clock period. When operating as expected in this period, pipelined ADC 100 samples the input signal (in timeframe 202), quantizes the input signal with the flash ADC 112 (in timeframe 206), applies DAC 114 (in timeframe 208), and amplifies the residue with gain amplifier 118 (in timeframe 210). As shown in timing diagram 200, these four functions are to be completed within about 240 picoseconds (ps) for sampling, 150 ps for the flash ADC 112, 90 ps for DAC 114, and 160 ps for gain amplifier 118, for a 1.5 GSPS system. Timeframes 206, 208, and 210 are to be completed in about 400 ps total (timeframe 204) for proper operation. If the flash quantization function does not complete within allotted timeframes, metastability may occur.

If flash ADC 112 does not resolve in time (e.g., 150 ps), there may be an error in the residue value, which is passed on to the next stage of pipelined ADC 100. If the flash ADC 112 does not resolve one of its bits in time, a metastability error occurs. Metastability may be resolved by providing flash ADC 112 more time to resolve. Other solutions may involve tradeoffs in performance, power, etc.

Timing diagram 200 shows that if a comparator within flash ADC 112 does not decide within 160 ps (timeframe 212), metastability is indicated. Metastability comparators (described below) may detect metastability after timeframe 212, and then regenerate in timeframe 214. Regeneration is the process of amplifying the voltage present between the comparator inputs and producing an output of the comparator. The regeneration takes 480 ps in one example.

Figure 3:
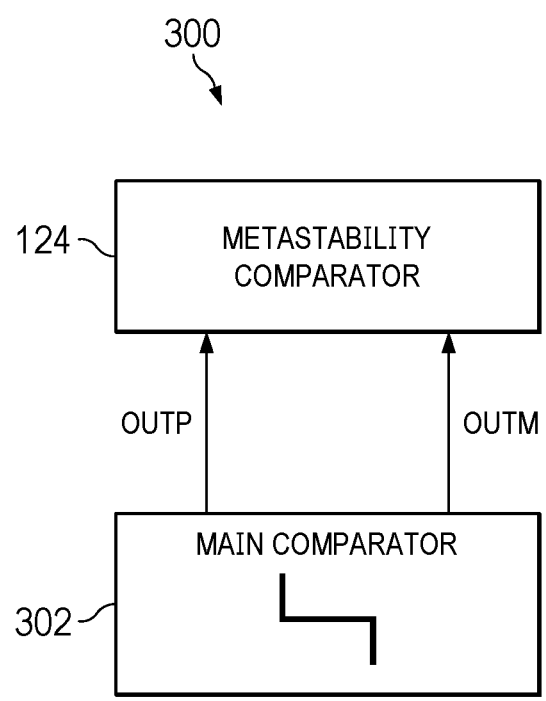
FIG. 3 is a block diagram of example apparatus for metastability detection.

FIG. 3 is a block diagram 300 of example apparatus for metastability detection. Block diagram 300 includes a metastability comparator 124 and a main comparator 302. In examples herein, flash ADC 112 includes a number of main comparators 302 to produce the output bits. In one example, flash ADC 112 produces 5 bits, and therefore has 32 main comparators 302 (e.g., 2^5). Each main comparator 302 is coupled to a metastability comparator 124. There are 32 metastability comparators 124 in this example. Each metastability comparator 124 receives a signal from its associated main comparator 302 that indicates whether that main comparator 302 has resolved. If the main comparator 302 has resolved, metastability comparator 124 may produce a 0 output. If the main comparator 302 has not resolved, metastability comparator 124 may produce a 1 output. If all 32 main comparators 302 resolve in time (e.g., within 160 ps), the flash ADC 112 is not metastable, and main path 120 is used. If any of the 32 main comparators 302 does not resolve in time, flash ADC 112 is considered metastable, and auxiliary path 122 is used.

Figure 4:
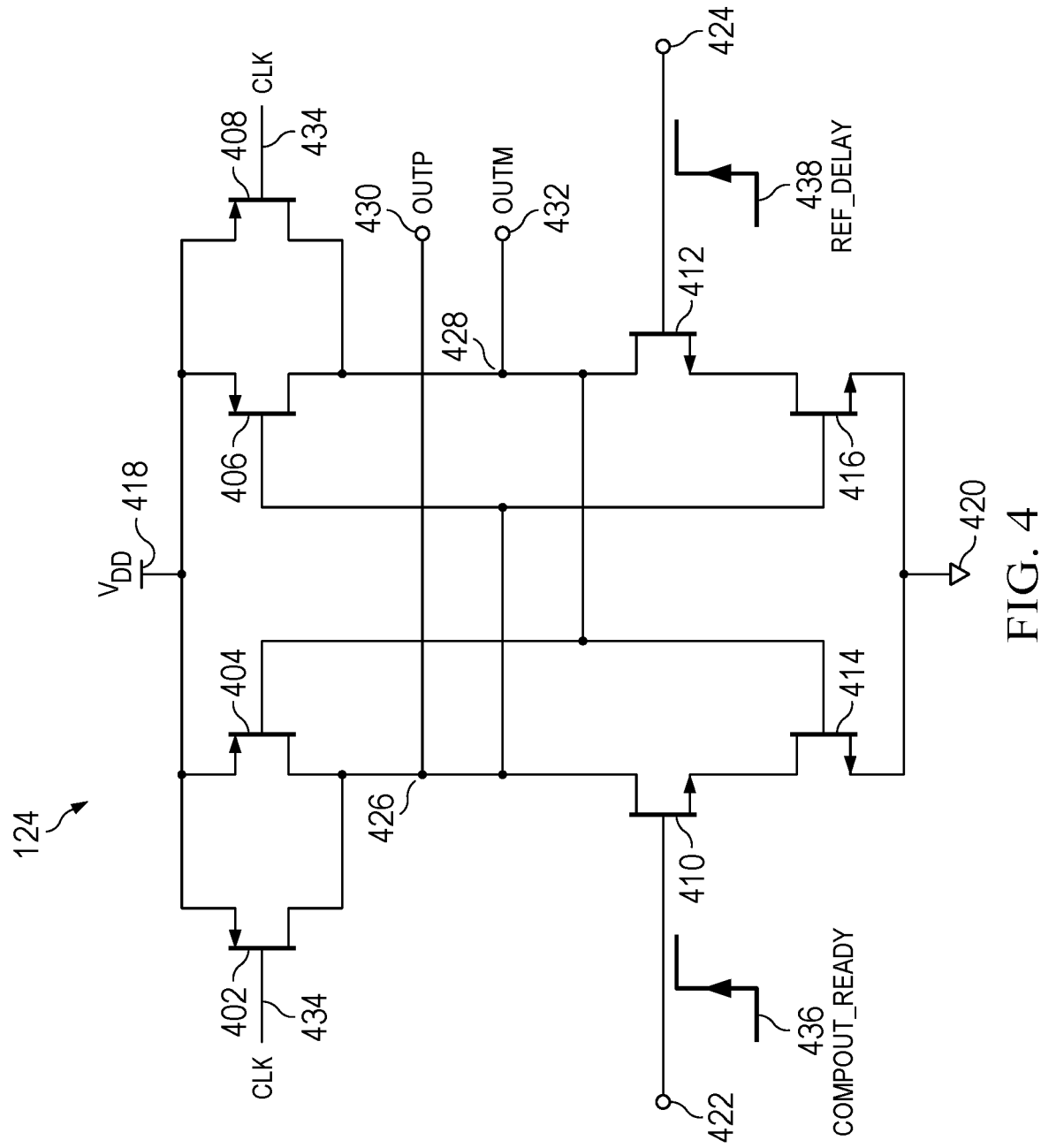
FIG. 4 is schematic diagram of an example metastability comparator.

FIG. 4 is a schematic diagram of an example metastability comparator 124. Metastability comparator 124 is a delay domain comparator in one example. In a delay domain comparator, the delay time corresponding to the inputs is compared rather than input voltages. The delay domain comparator produces a 0 or 1 output depending on which of two input signals is received first. Metastability comparator 124 includes transistors 402, 404, 406, 408, 410, 412, 414, and 416. In one example, transistors 402, 404, 406, and 408 are p-type transistors. In one example, transistors 410, 412, 414, and 416 are n-type transistors. Transistors 402, 404, 406, 408, 410, 412, 414, and 416 are field effect transistors (FETs) in one example. Other types of transistors may be useful in other examples. Each of the transistors includes two terminals and a control terminal. For example, the two terminals of a FET are the source and the drain, and the control terminal is the gate.

Metastability comparator 124 also includes first voltage terminal 418 and second voltage terminal 420. First voltage terminal 418 may receive a first voltage (such as $V_{DD}$), and second voltage terminal 420 may receive a second voltage (such as ground). Metastability comparator 124 also includes first input terminal 422, second input terminal 424, first output node 426, and second output node 428. Metastability comparator 124 includes first output terminal 430 (OUTP) and second output terminal 432 (OUTM). Various signals are also shown in FIG. 4, such as clock (CLK) 434, COMPOUT_READY 436 (comparator output ready), and REF_DELAY 438 (reference delay).

Transistor 402 has a gate coupled to a CLK 434 input, a source coupled to first voltage terminal 418, and a drain coupled to first output node 426. Transistor 404 has a gate coupled to the gate of transistor 414, a source coupled to first voltage terminal 418, and a drain coupled to first output node 426. Transistor 406 has a gate coupled to the gate of transistor 416, a source coupled to first voltage terminal 418, and a drain coupled to second output node 428. Transistor 408 has a gate coupled to a CLK 434 input, a source coupled to first voltage terminal 418, and a drain coupled to second output node 428.

Transistor 410 has a gate coupled to first input terminal 422, a source coupled to a drain of transistor 414, and a drain coupled to first output node 426. Transistor 412 has a gate coupled to second input terminal 424, a source coupled to a drain of transistor 416, and a drain coupled to second output node 428. Transistor 414 has a gate coupled to the gate of transistor 404, a source coupled to second voltage terminal 420, and a drain coupled to the source of transistor 410. Transistor 416 has a gate coupled to the gate of transistor 406, a source coupled to second voltage terminal 420, and a drain coupled to the source of transistor 412. Input signal COMPOUT_READY 436 is provided to first input terminal 422, and input signal REF_DELAY 438 is provided to second input terminal 424.

In operation, COMPOUT_READY 436 is the signal from one of the comparators in flash ADC 112 that indicates the comparator has provided an output signal and is not metastable. REF_DELAY 438 is a periodic signal that provides a pulse at a certain frequency, such as a pulse every 160 ps. The REF_DELAY 438 signal indicates how much time the comparators in flash ADC 112 are given to produce an output. If COMPOUT_READY 436 arrives at metastability comparator 124 before REF_DELAY 438, transistor 410 turns on before transistor 412, and first output node 426 is pulled down to the voltage value at second voltage terminal 420 (e.g., ground). The voltage value at first output terminal 430 (OUTP) is therefore low, and metastability comparator 124 produces a 0 output across OUTP and OUTM. The 0 output indicates that the comparator in flash ADC 112 coupled to this metastability comparator 124 is not metastable.

In another example, if COMPOUT_READY 436 arrives at metastability comparator 124 after REF_DELAY 438 (e.g., after 160 ps), transistor 412 turns on before transistor 410, and second output node 428 is pulled down to the voltage value at second voltage terminal 420 (e.g., ground). The voltage value at second output terminal 432 (OUTM) is therefore low, and metastability comparator 124 produces a 1 output across OUTP and OUTM. The 1 output indicates that the comparator in flash ADC 112 coupled to this metastability comparator 124 has not produced an output after 160 ps, and is metastable.

If any metastability comparator 124 produces a 1 output, the flash ADC 112 is considered metastable, and auxiliary path 122 is used for pipelined ADC 100, as described below. If all the metastability comparators 124 produce a 0 output, then each comparator in the flash ADC 112 has resolved within 160 ps, and the main path 120 may be used by pipelined ADC 100.

Figure 5:
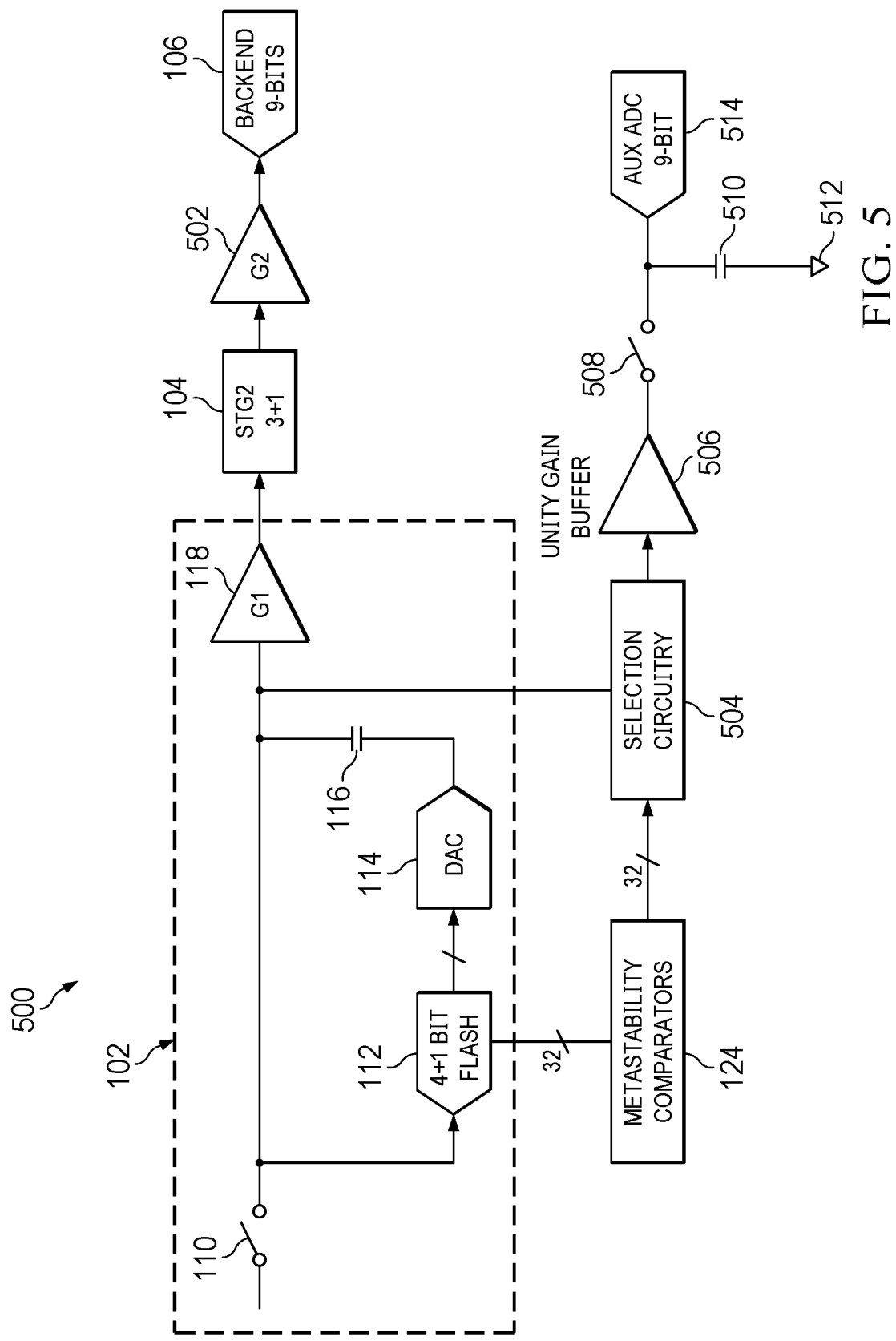
FIG. 5 is a block diagram of another example pipelined ADC.

FIG. 5 is a block diagram of another example pipelined ADC 500. Pipelined ADC 500 includes some components described above with respect to FIG. 1, and like numerals denote like components. The like components are structured and operate similarly to those in pipelined ADC 100, as described above. Pipelined ADC 500 includes a first stage 102, a second stage 104, and a backend ADC 106. First stage 102 includes switch 110, flash ADC 112, DAC 114, capacitor 116, and gain amplifier 118. Second stage 104 also includes elements similar to first stage 102, but those elements are not shown in FIG. 5, with the exception of the gain amplifier 502. First stage 102, second stage 104, backend ADC 106, and gain amplifier 502 are included in a main path. The gain G2 of gain amplifier 502 is a gain between 1.5× and 10× in some examples, but any value of G2 is useful in other examples. Gain amplifier 502 amplifies the residue from second stage 104 to provide an amplified value to backend ADC 106. Pipelined ADC 500 also includes an auxiliary path. The auxiliary path in this example includes metastability comparators 124, selection circuitry 504, buffer 506, switch 508, capacitor 510, voltage terminal 512, and ADC 514.

Flash ADC 112 has an input coupled to switch 110 and an output coupled to an input of DAC 114. DAC 114 has an output coupled to a first terminal of capacitor 116. Capacitor 116 has a second terminal coupled to switch 110 and an input of gain amplifier 118. Gain amplifier 118 has an output coupled to the input of the next stage of pipelined ADC 100, which is second stage 104 in this example. Second stage 104 has an output coupled to backend ADC 106. First stage 102, second stage 104, backend ADC 106, and ADC 514 are each coupled to timing alignment and digital error correction circuitry 108 (not shown in FIG. 5). Inputs of metastability comparators 124 are coupled to outputs of flash ADC 112. The output of the metastability comparators 124 is coupled to an input of selection circuitry 504. Selection circuitry 504 is also coupled to switch 110 and the input of gain amplifier 118. An output of selection circuitry 504 is coupled to an input of buffer 506. The output of buffer 506 is coupled to switch 508. Switch 508 is also coupled to a first terminal of capacitor 510 and the input of ADC 514. Capacitor 510 has a second terminal coupled to voltage terminal 512, which is ground in one example.

Metastable comparators 124 determine if any of the comparators within flash ADC 112 are metastable. If none of the flash ADC 112 comparators are metastable, selection circuitry 504 selects the main path for pipelined ADC 500. Selection circuitry 504 includes one or more transistor switches in one example, the operation of which may be controlled by a controller. Any appropriate selection circuitry is useful in other examples. If one or more of the flash ADC 112 comparators are metastable, selection circuitry 504 selects the auxiliary path for pipelined ADC 500. If the auxiliary path is selected, the residue at the input of gain amplifier 118 is provided to buffer 506. Switch 508 samples the signal at the output of buffer 506, and capacitor 510 stores the sampled signal in the auxiliary path to provide the signal to ADC 514. Switch 508 may operate similarly to switch 110 described above. Switch 508 is implemented with sample and hold circuitry in other examples. Capacitor 510 is a sampling capacitor that is multiple capacitors in parallel, in one example. ADC 514 is similar to backend ADC 106 in one example, and operates similarly to produce 9 digital bits.

As described above with respect to FIG. 2, DAC 114 produces an output signal before gain amplifier 118 begins operation. In the operation of pipelined ADC 500, the residue value from flash ADC 112 is provided to gain amplifier 118. Pipelined ADC 500 includes an auxiliary path for use if metastability is detected. The auxiliary path includes buffer 506, which is a unity gain buffer or amplifier in one example. In the main path, the value provided at the input of gain amplifier 118 settles before integration begins with gain amplifier 118 (e.g., DAC 114 produces an output signal before the gain function begins). In the auxiliary path, buffer 506 is faster than gain amplifier 118. Because the auxiliary path saves the approximately 160 ps of gain time used by gain amplifier 118 (e.g., timeframe 210 in FIG. 2), the extra 160 ps may be used by the flash ADC 112 to complete its operations. A delayed DAC 114 output for the auxiliary path does not create the problems that a delayed DAC 114 output produces for the main path.

In this example, the auxiliary path has 4 bits (from flash ADC 112) plus 9 bits (from ADC 514), for a total of 13 bits. The main path has 4 bits (from flash ADC 112), 3 bits from second stage 104, and 9 bits from backend ADC 106, for a total of 16 bits. In an example, the time constant in the flash ADC 112 is approximately 5.5 ps, so 160 ps provides 28 more time constants for flash ADC 112 to complete its operations. This additional time helps to overcome metastability significantly. With the additional time for flash ADC 112, BER improves from 3e-4 to 2.8e-15. However, the auxiliary path provides 13 bits compared to the 16 bits of the main path. A loss of 3 bits causes an error of 8 least significant bits (e.g., 2^3). However, the BER has two components: the amount of the error and the probability of the error. An error of plus or minus 8 least significant bits (LSBs) may be tolerable during metastability conditions, compared to a possible error of 2048 LSBs described above. With the auxiliary path, the BER is 2.8e-15, in one example, which is an improvement compared to other systems.

Figure 6:
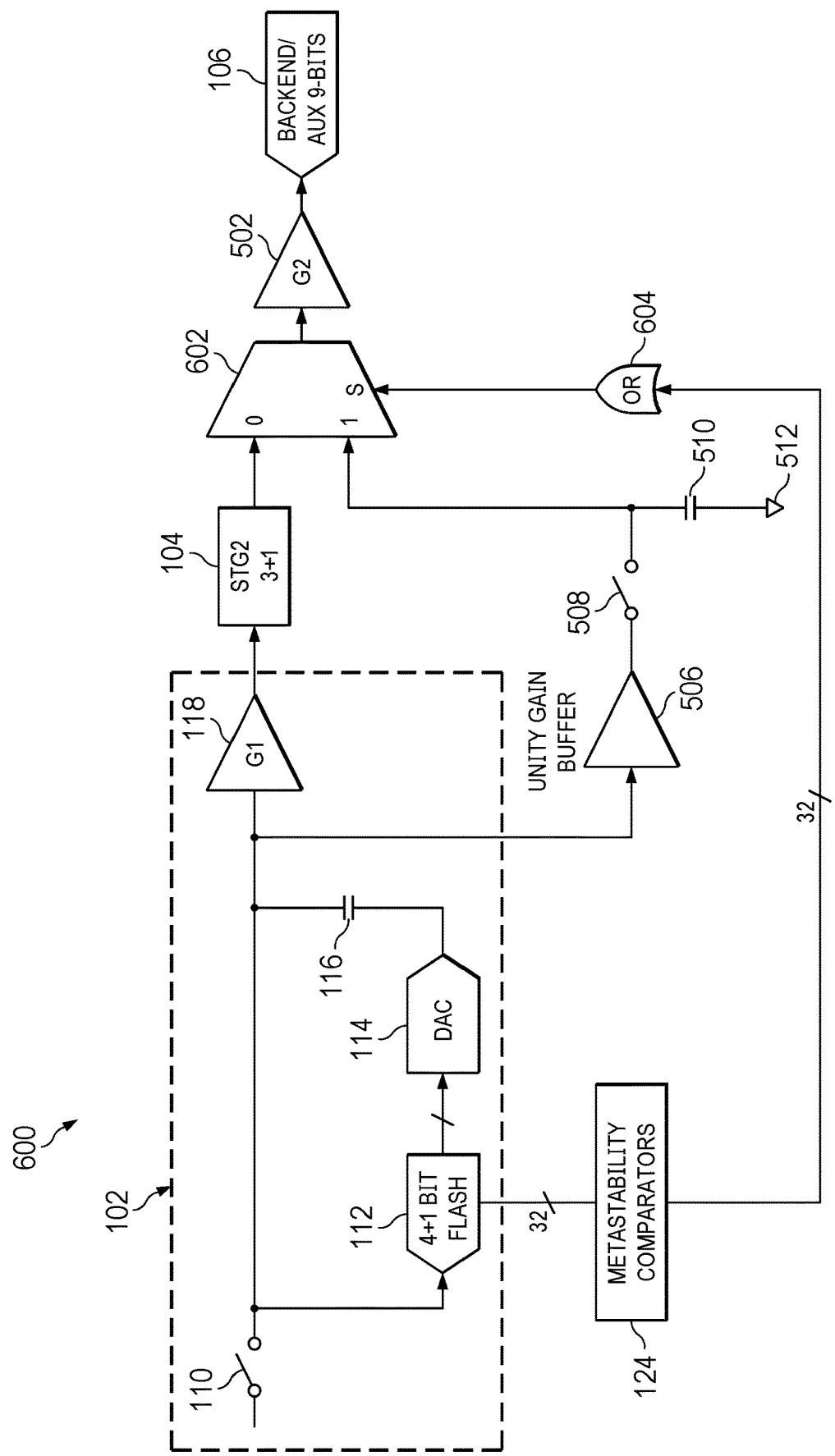
FIG. 6 is a block diagram of another example pipelined ADC.

FIG. 6 is a block diagram of another example pipelined ADC 600. Pipelined ADC 600 includes some components described above with respect to FIG. 5, and like numerals denote like components. Pipelined ADC 600 includes a first stage 102, a second stage 104, and a backend ADC 106. First stage 102 includes switch 110, flash ADC 112, DAC 114, capacitor 116, and gain amplifier 118. Second stage 104 also includes elements similar to first stage 102, but those elements are not shown in FIG. 6, except for the gain amplifier 502. First stage 102, second stage 104, backend ADC 106, multiplexer 602, and gain amplifier 502 are included in main path 120 (shown in FIG. 1). Pipelined ADC 600 also includes an auxiliary path. The auxiliary path in this example includes metastability comparators 124, buffer 506, switch 508, capacitor 510, voltage terminal 512, and OR gate 604 (e.g., a logic gate or logic circuit).

Flash ADC 112 has an input coupled to switch 110 and an output coupled to an input of DAC 114. DAC 114 has an output coupled to a first terminal of capacitor 116. Capacitor 116 has a second terminal coupled to switch 110, an input of gain amplifier 118, and an input of buffer 506. Gain amplifier 118 has an output coupled to the input of the next stage of pipelined ADC 100, which is second stage 104 in this example. Second stage 104 has an output coupled to a first input of multiplexer 602. Multiplexer 602 has a second input coupled to switch 508. Multiplexer 602 has a selection input coupled to the output of OR gate 604. Multiplexer 602 has an output coupled to gain amplifier 502. Gain amplifier 502 has an output coupled to backend ADC 106. First stage 102, second stage 104, and backend ADC 106 are each coupled to timing alignment and digital error correction circuitry 108 (not shown in FIG. 6). Inputs of metastability comparators 124 are coupled to outputs of flash ADC 112. The output of the metastability comparators 124 is coupled to OR gate 604. Buffer 506 has an input coupled to an input of gain amplifier 118 and an output coupled to switch 508. Switch 508 is also coupled to capacitor 510 and the second input of multiplexer 602. Capacitor 510 is also coupled to voltage terminal 512, which is ground in one example.

In pipelined ADC 600, multiplexer 602 and OR gate 604 are used to select between the main path and the auxiliary path. Multiplexer 602 is a path selection circuit that includes a control input or a select input. In other examples, a path selection circuit includes circuitry other than a multiplexer (such as transistor switches). Pipelined ADC 600 re-uses backend ADC 106 for both the main path and the auxiliary path, which may provide some area and power savings compared to pipelined ADC 500 in FIG. 5. In pipelined ADC 600, metastable comparators 124 detect if any of the comparators within flash ADC 112 are metastable. If none of the flash ADC 112 comparators are metastable, OR gate 604 provides a low output signal to the control input of multiplexer 602. Responsive to this low signal from OR gate 604 (e.g., the control input), multiplexer 602 selects the main path, and couples second stage 104 to gain amplifier 502. If one or more of the flash ADC 112 comparators are metastable, OR gate 604 provides a high output signal to multiplexer 602. Responsive to this high signal from OR gate 604, multiplexer 602 selects the auxiliary path, and couples buffer 506 to gain amplifier 502.

Figure 7:
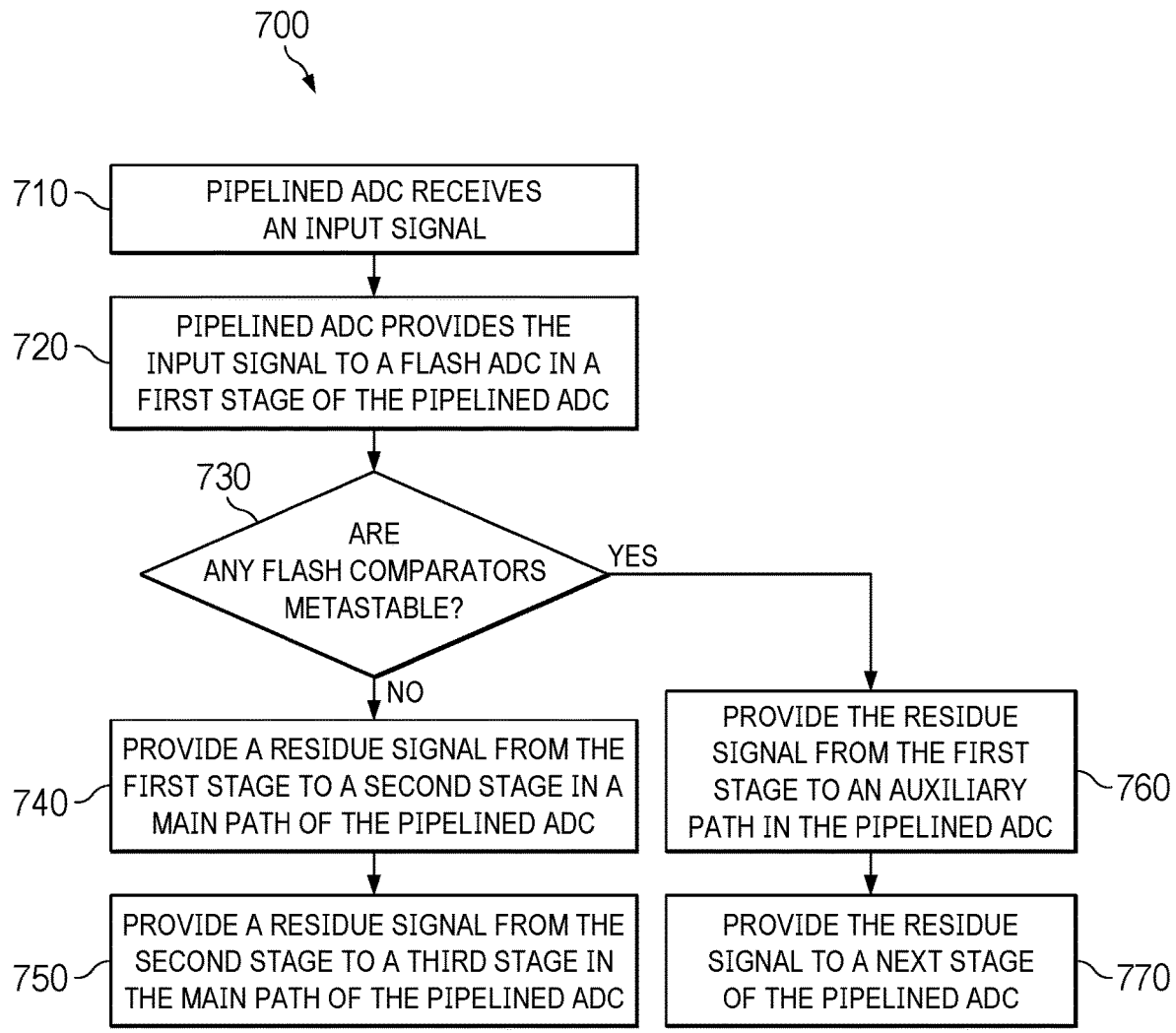
FIG. 7 is flow diagram of an example method for metastability detection.

FIG. 7 is a flow diagram of an example method 700 for metastability detection. The steps of method 700 may be performed in any suitable order. The hardware components described above with respect to FIGS. 1 and 3-6 perform method 700 in some examples. Any suitable hardware, software, or digital logic performs method 700 in other examples.

Method 700 begins at 710, where a pipelined ADC receives an input signal. The input signal may be an analog signal for the pipelined ADC to convert to a digital signal. Pipelined ADC 100, 500, or 600 may perform the operations described herein. The pipelined ADC may include any number of stages, and may resolve any number of bits.

Method 700 continues at 720, where the pipelined ADC provides the input signal to a flash ADC in a first stage of the pipelined ADC. The flash ADC is flash ADC 112, in one example. Flash ADC 112 may include a number of flash comparators to perform the analog-to-digital conversion. In one example, flash ADC 112 includes 32 flash comparators.

Method 700 continues at 730, where metastability comparators determine or detect if any of the flash comparators are metastable. Each flash comparator may be coupled to a metastability comparator, such as metastability comparators 124. The metastability comparators 124 are delay domain comparators, in one example. A metastability comparator 124 may determine that a flash comparator is metastable if the flash comparator has not produced an output after a certain amount of time has passed.

If all the flash comparators are not metastable (e.g., each flash comparator has provided an output within the predetermined time frame), method 700 continues to 740. At 740, pipelined ADC provides a residue signal from the first stage to a second stage in a main path of the pipelined ADC. In one example, the residue signal is provided from first stage 102 to second stage 104.

Method 700 continues at 750, where a residue signal from the second stage 104 is provided to a third stage (e.g., backend ADC 106) in a main path of the pipelined ADC. The pipelined ADC may include any number of stages, and the stages can produce any number of digital output bits in the main path.

If any of the flash comparators are metastable in 730, method 700 proceeds to 760. At 760, the residue signal from the first stage is provided to an auxiliary path in pipelined ADC. The auxiliary path provides additional time for the flash comparators to resolve, in order to reduce the probability of metastability in the flash comparators. One example of an auxiliary path is auxiliary path 122 in FIG. 1. The auxiliary path receives the residue from first stage 102, when one or more flash comparators are metastable.

Method 700 continues at 770, where the auxiliary path provides the residue (from first stage 102) to a next stage of the pipelined ADC. The next stage may be another auxiliary ADC, such as ADC 514 in FIG. 5 (e.g., a backend ADC). In another example, the next stage is a stage of the main path of the pipelined ADC, such as backend ADC 106 as shown in FIG. 6.

In examples herein, delay domain comparators detect the metastability of the flash ADC comparators. The residue of the first stage of the pipelined ADC is provided to the main path of the ADC or an auxiliary path. If no metastability is detected, the residue passes to the main path. If the delay domain comparators detect metastability, the residue is provided to the auxiliary path, which provides more time for the flash ADC comparators to settle. Because of the additional time for settling, the BER may be improved. Multiple architectures are described herein for implementing the auxiliary path.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

What is claimed is:

1. A system, comprising:
a pipelined analog-to-digital converter (ADC) having a main path and an auxiliary path, wherein the main path includes:
a first stage having a sampling switch, a flash ADC having an input coupled to the sampling switch, a digital-to-analog converter (DAC) having an input coupled to an output of the flash ADC, and a first amplifier having an input coupled to an output of the DAC and the sampling switch, wherein the first stage is configured to produce a sample of an input signal and produce a first residue value;
a second stage coupled to the first stage and an input of a second amplifier, wherein the second stage is configured to produce a sample of the first residue value and produce a second residue value; and
a backend ADC having an input coupled to an output of the second amplifier, wherein the backend ADC is configured to produce a sample of the second residue value and to quantize the second residue value; and
wherein the auxiliary path includes:
a plurality of metastability comparators coupled to the flash ADC, wherein each metastability comparator is configured to detect a metastability of a comparator in the flash ADC.

2. The system of claim 1, further comprising:
a buffer having an input coupled to the output of the DAC and the sampling switch;
a multiplexer having a first input coupled to an output of the buffer and a second input coupled to the second stage, wherein the multiplexer is configured to select between the output of the buffer and the second stage; and
a logic gate coupled to the plurality of metastability comparators and to the multiplexer, wherein the logic gate is configured to control a control input of the multiplexer.

3. The system of claim 2, wherein the logic gate is an OR gate.

4. The system of claim 2, wherein the multiplexer is configured to select the output of the buffer responsive to a metastability comparator detecting a metastability of a comparator in the flash ADC.

5. The system of claim 2, wherein the auxiliary path includes a sampling capacitor coupled to an output of the buffer.

6. The system of claim 1, wherein the first stage is configured to produce a sample of the input signal having a first number of bits, the second stage is configured to produce a sample of the first residue value having a second number of bits, and the backend ADC is configured to produce a sample of the second residue value having a third number of bits.

7. The system of claim 1, wherein each metastability comparator is a delay domain comparator.

8. The system of claim 1, further comprising:
a sampling capacitor between the output of the DAC and the first amplifier.

9. The system of claim 1, wherein the main path produces a sample having a first number of bits, and the auxiliary path produces a sample having a second number of bits, where the second number of bits is smaller than the first number of bits.

10. A pipelined analog-to-digital converter (ADC) comprising:
a first ADC path including:
a first stage ADC including a flash ADC and a first amplifier coupled to the flash ADC, the first amplifier having an input and an output;
a second stage ADC having an input coupled to the output of the first amplifier, and having an output;
a second amplifier having an input and an output; and
a third stage ADC having an input coupled to the output of the second amplifier;
a second ADC path coupled to the input of the first amplifier, and having an output;
a metastability comparator having an input coupled to the flash ADC, and having an output;

a logic circuit having an input coupled to the output of the metastability comparator and having an output; and a path selection circuit having a first input coupled to the output of the second stage ADC, having a second input coupled to the output of the second ADC path, having a select input coupled to the output of the logic circuit, and having an output coupled to the input of the second amplifier.

11. The pipelined ADC of claim 10, wherein the path selection circuit includes a multiplexer having the first, second, and select inputs.

12. The pipelined ADC of claim 10, wherein the logic circuit includes an OR gate having the input coupled to the output of the metastability comparator and having the output coupled to the select input of the path selection circuit.

13. The pipelined ADC of claim 10, wherein the first stage ADC includes:
a sampling switch having a terminal coupled to an input of the flash ADC and to the input of the first amplifier;
a digital-to-analog converter (DAC) having an input coupled to an output of the flash ADC, and having an output; and
a sampling capacitor having a first terminal coupled to the output of the DAC and having a second terminal coupled to the input of the first amplifier.

14. The pipelined ADC of claim 10, wherein the second ADC path includes:
a buffer having an input coupled to the input of the first amplifier, and having an output;
a sampling switch having a first terminal coupled to the output of the buffer, and having a second terminal coupled to the second input of the path selection circuit; and
a sampling capacitor having a terminal coupled to the second input of the path selection circuit.

15. The pipelined ADC of claim 10, wherein the flash ADC includes a comparator, and the metastability comparator is coupled to the comparator.

16. The pipelined ADC of claim 10, wherein the metastability comparator is a delay domain comparator.

17. A system, comprising:
a pipelined analog-to-digital converter (ADC) having a main path and an auxiliary path, wherein the main path includes:
a first stage having an input, an output, a sampling switch, a flash ADC coupled to the sampling switch, a digital-to-analog converter (DAC) coupled to the flash ADC, and a first amplifier coupled to the DAC and the sampling switch;
a second stage having an input coupled to the output of the first stage and to an input of a second amplifier; and
a first backend ADC having an input coupled to an output of the second amplifier; and
wherein the auxiliary path includes:
a plurality of metastability comparators coupled to the flash ADC;
selection circuitry coupled to an output of the DAC and the plurality of metastability comparators;
a buffer having an input and an output, the input coupled to an output of the selection circuitry; and
a second backend ADC coupled to the output of the buffer.

18. The system of claim 17, wherein the buffer is a unity gain buffer.

19. The system of claim 17, wherein each metastability comparator is coupled to a comparator in the flash ADC.

20. The system of claim 19, wherein each metastability comparator is a delay domain comparator.

* * * * *